METHOD OF MANUFACTURING SEMICONDUCTOR DEVICE

Filed Dec. 6, 1966 3 Sheets-Sheet 1

3,519,479

METHOD OF MANUFACTURING SEMICONDUCTOR DEVICE

Morio Inoue and Gota Kano, Suita-shi, and Jinichi Matsuno and Shigetoshi Takayanagi, Kyoto, Japan, assignors to Matsushita Electronics Corporation, Osaka, Japan, a corporation of Japan Filed Dec. 6, 1966, Ser. No. 599,613
Claims priority, application Japan, Dec. 16, 1965, 40/77,689, 40/77,690, 40/77,691
Int. Cl. H01l 7/00, 7/36
U.S. Cl. 117—200 8 Claims

ABSTRACT OF THE DISCLOSURE

In an improved chemical evaporation-deposition method, hydrogen and halides of tungsten or molybdenum in gaseous form are preheated and deposited as a metal film on a substrate held at a temperature below 500° C.

In this method, an improved semiconductor device having a Schottky barrier on a semiconductor substrate and other electrical devices employing the metal film on the substrate are manufactured.

DISCLOSURE

The present invention relates to a method and apparatus for producing a metallic film of molybdenum or tungsten on a semiconductor substrate, more particularly germanium, silicon or gallium arsenide to form a Schottky barrier between the substrate and the deposited film.

Hitherto, semiconductors, having a Schottky barrier, have been manufactured by contacting appropriate metals with appropriate semiconductors by the methods of vacuum evaporation, electroplating, chemical deposition, point contact, or other like methods. For obtaining an ideal Schottky barrier, it has been a necessary condition that no oxide or other insulating substances be present on the semiconductor nor any chemically continuous intermediary substances be formed at the boundary between the semiconductor and metal and also that a metal film deposited on the semiconductor should be an unbroken film, except in the case of point contact. Most of the known combinations of a semiconductor and a metal have failed to satisfy such conditions thereby rendering the formation of a Schottky barrier extremely difficult. Accordingly, only those materials which were known to be adaptable to practical use, namely, noble metals such as gold coated on germanium, silicon, or gallium arsenide by the method of vacuum evaporation, or tungsten coated by the method utilizing a substitution reaction of a sort were employed in such semiconductors.

It is known that molybdenum and tungsten are good metals for use in forming Schottky barrier diodes. Molybdenum and tungsten generally cannot be deposited from a solution by the method of electroplating. Moreover, the technique required to form a barrier having a good rectifying action between molybdenum or tungsten and a semiconductor, either by the method of vacuum deposition, electron beam evaporation or chemical deposition, is very difficult. However, a comparatively good barrier can be formed by the method of point contact followed by an electric forming process. However, since this contact is formed only by a mechanical attachment, it may not be possible to avoid structural instability. For these reasons, molybdenum and tungsten hitherto have not been generally used.

There are two known methods generally included in the methods of chemical deposition of molybdenum and tungsten; in one, halides of molybdenum or tungsten are thermally decomposed, and, in the other, they are hydrogen reduced. Either method usually employs temperatures of over 500° C. since it is very difficult to deposit a metal film at less than 500° C.

When a metal film is deposited through hydrogen reduction of a metal halides, the reactions $$MoCl_5 + \frac{5}{2}H_2 \longrightarrow Mo + 5HCl \text{ and } WCl_6 + 3H_2 \longrightarrow W + 6HCl$$

are difficult to produce if the temperature of the semiconductor substrate is reduced below 500° C. Even if a film is deposited near 500° C., it is unstable, hygroscopic and subject to oxidation. Moreover, this film does not give a uniform and stable barrier.

A known method which makes possible the chemical deposition of molybdenum, not aiming at the forming of a Schottky barrier, includes hydrogen reduction of molybdenum halides, e.g., the vapor of molybdenum pentachloride ($MoCl_5$), by which metallic molybdenum is deposited on a semiconductor. The semiconductor must be heated to a temperature over 500° C. and be maintained at that temperature level throughout the deposition. At this high temperature, however, a solid reaction is induced with the semiconductor at the same time that metallic molybdenum is deposited, and as a result, such molybdenum germanides as $MoGe_n$ (wherein $n$ is 3 at the maximum) are yielded if the semiconductor is of germanium, and such molybdenum silicides as $MoSi_n$ (wherein $n$ is 2 at the maximum) are yielded if the semiconductor is of silicon. Consequently, an ideal molybdenum-substrate Schottky barrier cannot be formed. In the chemical deposition of tungsten, wherein the metal is deposited on a semiconductor substrate, the latter being heated to over 500° C., a solid phase reaction takes place at the boundary in the process of deposition, forming substances of chemically continuous compositions, for example, such tungsten silicides as $WSi_2$. Thus, an ohmic contact is formed between the film and the substrate, and as a result, a barrier suitable for a rectifying action of a semiconductor is not obtainable. Accordingly, these methods, while advantageous for obtaining an ohmic contact, are not readily adaptable for the manufacture of a semiconductor device of the present invention.

In order to avoid the solid phase reaction between the semiconductor substrate and deposited metal, the metal must be deposited on a substrate having a temperature under 500° C. However, this condition runs counter to the above-mentioned argument that the temperature should be over 500° C.

In order to resolve the dilemma described above, a known method proposes utilizing a substitution reaction of a sort in which the tungsten film is deposited on the aforementioned semiconductor substrate from, for example, tungsten hexafluoride through thermal decomposition within a temperature range of 350° C. to 500° C. However, such a method will produce only a very thin tungsten film having only slightly more than 10 atom layers on the crystal surface of silicon. Moreover, the material capable of depositing a metal film within the temperature range of 350° C. to 500° C. is limited to tungsten fluorides which are especially chemically unstable and intractable among the halogenides as described above.

In another method, for example, molybdenum or tungsten carbonyl is thermally decomposed at low temperatures to deposit a molybdenum or a tungsten film. But, this method produces only an amorphous metal film.

In other words, by the prior-art methods described above, it is impossible to produce from molybdenum and tungsten, at low temperatures and with good reproducibility, a semiconductor having a good Schottky barrier.

It is therefore an object of the present invention to provide a method for forming a semiconductor device by heating a semiconductor substrate of germanium, silicon or gallium arsenide to a temperature below 500° C. and depositing thereon metallic molybdenum or tungsten by forming a gaseous mixture of molybdenum or tungsten halides through hydrogen reduction and passing the mixture over the substrate to thereby form a Schottky barrier between the molybdenum or tungsten and the semiconductor.

Another object of the present invention is to provide an improved Schottky barrier semiconductor.

A further object of the present invention is to provide an apparatus for the manufacture of Schottky barrier semiconductors.

The means for accomplishing the foregoing objects and other advantages, which will be apparent to those skilled in the art, are set forth in the following specification and claims and are illustrated in the accompanying drawings dealing with a basic embodiment of the present invention. Reference is made now to the drawings in which:

Figure 1:
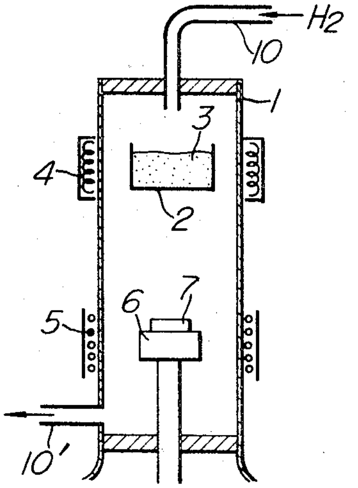
FIG. 1 is a vertical section through a known device which can be used to obtain an ohmic contact.

FIG. 1 shows one example of a known apparatus suitable for carrying out a method for obtaining an ohmic contact in which, for example, molybdenum halides 3 are placed on the holder 2 of a quartz reaction tube 1 and are heated to 100° C. by a resistance heater 4. Hydrogen gas enters the reaction tube through conduit 10 and is passed over the molybdenum halides to make a mixture of molybdenum halide vapor and hydrogen gas, which is passed over a semiconductor substrate 7 on the heating pedestal 6. The gaseous mixture leaves the reaction tube through conduit 10'. The semiconductor substrate is maintained at a temperature over 500° C. by means of a high-frequency heating device 5. At the surface of the semiconductor substrate 7, the reduction reaction:

$$MoX_5 + \frac{5}{2} H_2 \rightleftarrows Mo + 5HX$$

is performed thereby depositing metallic molybdenum in the form of a film on the substrate.

In the event a halide of tungsten is placed on holder 2, reduction reaction $WX_6+3H_2 \rightleftarrows W+6HX$ will take place at the surface of the semiconductor substrate 7 causing deposition of a tungsten film on the substrate. The deposited tungsten forms chemically continuous intermediary substances through a solid phase reaction, with the aforementioned substrate, that takes place simultaneously during the deposition, thereby forming an ohmic contact at the boundary between the film and substrate.

With such a conventional method and apparatus as described above, the maintenance of a temperature over 500° C. is set as a required condition. Deposition of molybdenum and tungsten at a temperature below 500° C. has not been heretofore successful. However, experiments conducted during the development of the present invention gave the following result, namely, that while deposition on a substrate at a temperature below 500° C. was hitherto believed to be entirely impossible, at temperatures in the range of 450° C. to 500° C., deposition could be observed. The product of such deposition, because the temperature of the semiconductor substrate was low and therefore the aforementioned reduction reaction could not be carried out sufficiently, was merely a mixture of molybdenum or tungsten and the lower halides thereof. The molybdenum deposit had the appearance of a colored, soft film, which was easily absorbed and was of an entirely different nature from a film of metallic molybdenum. The tungsten deposit was also hygroscopic and presented a colored, soft, filmy appearance entirely different from a pure tungsten film. However, no such chemically continuous intermediary substance as mentioned above could be observed at the boundary between the deposited film and the semiconductor substrate. Also the voltage-current characteristic had a slight nonlinearity at the boundary. The maximum rectification ratio was only about 10 and the reproducibility, where stability has a bearing, was extremely low. In otherwords, the existence of an electrical barrier, having a rectifying characteristic, could be confirmed.

In the present invention, further study was conducted about the result mentioned above, resulting in finding that, by using hydrogen-reduced halides of molybdenum, if the reduction reaction is activated or accelerated by preheating, an excellent Schottky barrier may be formed on the substrate even if the temperature is below 500° C.

The semiconductor device of the present invention has been newly developed on the basis of the above conception. Namely, a semiconductor substrate consisting of germanium, silicon or gallium arsenide is held at a temperature below 500° C., and a complete metallic molybdenum or tungsten film is deposited thereon, through hydrogen reduction of the halides, by passing a preheated mixed gas of halides of the selected metal and hydrogen over the substrate thereby forming an ideal Schottky barrier between the metallic film and the substrate. A semiconductor device having the above characteristic may be used as an ultrafast switching diode, a microwave mixer and detector diode, a varactor diode, a high-power diode, and a thin-film diode and besides have a wide range of applications including the emitter or collector of a metal base transistor or field effect transistor, radiation detector, and photodiode.

The present invention will be described in detail below with reference to FIGS. 2 to 10.

Figure 2:
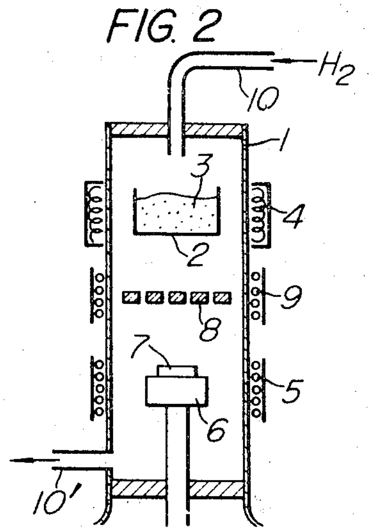
FIG. 2 is a vertical section through the apparatus used in an embodiment of the present invention.

FIG. 2 shows an example of an apparatus used for the manufacture of the semiconductor device of the present invention. This apparatus is somewhat similar to the prior art apparatus shown in FIG. 1 with the improvement being a mesh-shaped or comb-shaped preheater 8 installed between the holder 2 and the heating pedestal 6. A high-frequency heating device 9 heats the preheater 8 to within the range of 600° C. to 900° C. and maintains it at that level. The semiconductor substrate on the heating pedestal 6 is held in the range of above 390° C. and below 500° C. by R.F. heater 5 but not over 500° C. as in the prior art.

The present invention is unique in two respects in that the mixed gas of the vapor of the metal halides and hydrogen gas is preheated before being passed over the semiconductor substrate and that the semiconductor substrate is held within the temperature range of 390° C. to 500° C. Referring to FIG. 2, the mixed gas of the vapor emerging from the metal halides and hydrogen gas is not directly blown onto the semiconductor substrate 7 but is passed through the preheater 8, which is held at between 600° C. to 900° C. and then passed onto the semiconductor substrate 7. In this example, a mesh-shaped preheater 8, preferable for deposition of a better tungsten film, is shown and the appropriate distance between the preheater 8 and the semiconductor substrate 7 is 0.5 to 1.5 cm.

In the prior art method, the mixture of metal halide vapor and hydrogen gas was not preheated but was at a temperature lower than that of the semiconductor substrate 7 and passed directly over the substrate. The inventive method, which includes the preheating of the gaseous mixture with preheater 8 just before deposition, not only prevents a drop of the surface temperature of the substrate but also activates the mixed gas. Moreover, preheating invigorates the hydrogen reduction reaction:

$$MoX_5 + \frac{5}{2} H_2 \longrightarrow Mo + 5HX$$

and $$WX_6 + 3H_2 \longrightarrow W + 6HX$$

The above reduction reactions expedite the cleaning effect of the hydrogen halides formed on the surface of the semiconductor substrate. As a result, a perfect molybdenum or tungsten film can be deposited on a semiconductor substrate, the latter being held at a temperature below 500° C., which was not heretofore possible.

The metal film thus deposited on the semiconductor substrate does not contain undecomposed molybdenum or tungsten halides and is stable chemically and has a metallic gloss in spite of the fact that the semiconductor substrate is held between 390° C. and 500° C. Moreover, it has a uniform surface thickness, and since the semiconductor substrate is held below 500° C., no chemically continuous intermediary substance will be formed at the boundary between the substrate and the metal film. This is made possible by preventing a temperature drop of the semiconductor surface, activation of the mixed gas consisting of the metal halides and hydrogen gas, cleaning of the semiconductor surface effected by the product of the reduction reaction, and the uniform blowing of the gaseous mixture all over the surface of the substrate. Accordingly, a Schottky barrier having a good rectifying characteristic may be formed. However, if the temperature of the semiconductor substate is set above 500° C., an intermediary substance will be formed, as was the case in the prior art, with the result that the rectifying characteristic will be deteriorated. This point calls for particular attention.

By the proper choice of the shape of the preheater, the mixed gas can be uniformly blown all over the semiconductor substrate surface. In this way, the metal film that is deposited on the substrate becomes uniform with regard to thickness.

Further description will be made by citing a specific embodiment for molybdenum.

First, an N-type silicon crystal plate of 0.005 Ω/cm. resistivity and a thickness of 0.15 mm. was prepared, and an N-type silicon epitaxial layer of 1 to 5 Ω/cm. resistivity and 1 to 5μ in thickness was formed thereon by thermal decomposition of silicon tetrachloride ($SiCl_4$). This plate was used as the semiconductor substrate 7, which was mounted on the heating pedestal 6 of the device shown in FIG. 2. The substrate was heated to 400° C. to 500° C. by means of radio frequency heater device 5. At the same time molybdenum pentachloride ($MoCl_5$) was placed in the holder 2, which was held at 100° C. by heater 4. Hydrogen gas was let in at a rate of 1 liter per minute from the conduit 10. Thus, a mixture of molybdenum pentachloride vapor and hydrogen gas was produced and passed through the mesh-shaped preheater 8, which was held at 600° C. to 900° C. by a radio frequency heater 9. The preheated mixture then passed over the silicon substrate 7 when a molybdenum film was deposited on the substrate. In this example the distance between the silicon substrate 7 and preheater 8 was set at 1.0 cm., while the optimal temperature of the silicon substrate 7 was 450° C. to 480° C., while the optimal temperature of preheater 8 was 650° C. to 800° C.

Then, either aluminum, gold, nickel, or copper, was deposited onto the molybdenum film so as to connect the electrode. With the exception of the needed area, the top metal film, the molybdenum film and the silicon epitaxial layer were etched by using a photoetching technique. This removal of the epitaxial layer from the active area prevents formation of large area channels near the active area. Ohmic connections were made on the back surface by alloying gold-antimony at 370° C. as a top electrode, a gold wire, or a gold ball was bonded onto the electrode metal film. A diode as shown in FIG. 3 was thus obtained.

Figure 3:
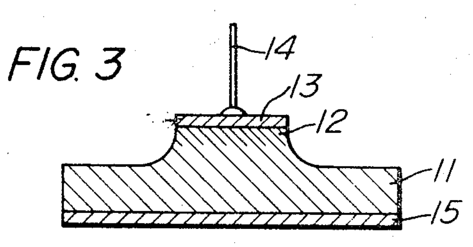
FIG. 3 is a vertical cross section of a semiconductor as an example of the present invention.
Figure 4:
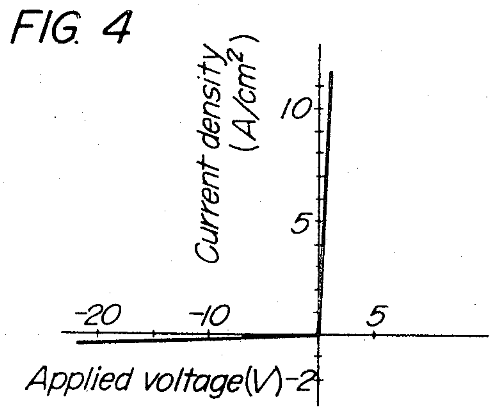
FIG. 4 is a graph indicating the general current-voltage characteristics of a semiconductor according to FIG. 3, having a molybdenum film.

In FIG. 3 reference numeral 11 is a silicon substrate, 12 is an epitaxial layer, 13 is a molybdenum film, and 14 is a gold wire or copper ball electrode, and 15 is an ohmic electrode. Diodes manufactured with a molybdenum film have current-voltage characteristics as shown in FIG. 4 and, in general, have the forward voltage-current characteristics as shown in the straight line (1) of FIG. 5 while the line (2) in the same figure represents the characteristic of a silicon-tungsten diode, tested by Dr. C. R. Crowel et al. J. C. Sarace, S. M. Sze (Transaction of Metallurgical Society of AIME, 1965, pp. 478–480).

Figure 6:
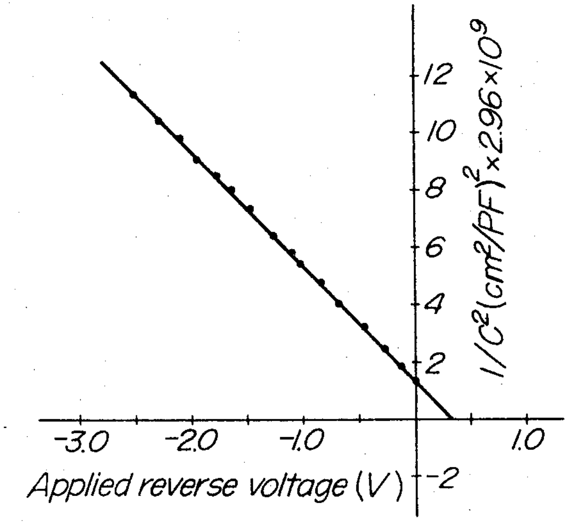
FIG. 6 is a graph showing the capacitance-voltage characteristic of a semiconductor according to FIG. 3, having a molybdenum film.
Figure 7:
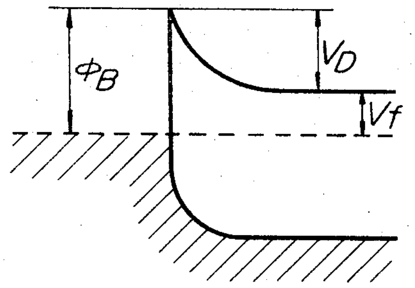
FIG. 7 is an energy-band graph at the barrier of a semiconductor according to FIG. 3, having a molybdenum film.

Furthermore, the diodes, exemplifying the invention, have a capacitance-voltage characteristic as shown in FIG. 6 while the structure of the energy band thereof is shown in FIG. 7.

Generally, the current-voltage characteristic of the Schottky barrier is represented by the following equations:

(1) $J = J_s[\exp(qV/nkT) - 1]$ (2) $J_s = A^*T^2 \exp(-q\phi_B/kT)$ where J is the current density, $J_s$ is the reverse saturation current density, $q$ is the electron charge, V is the voltage applied on the barrier, $k$ is the Boltzmann constant, T is the absolute temperature, $A^*$ is the Richardson constant, $n$ is an empirical constant, and $\phi_B$ is the barrier height measured with respect to the Fermi level as shown in FIG. 7.

Figure 5:
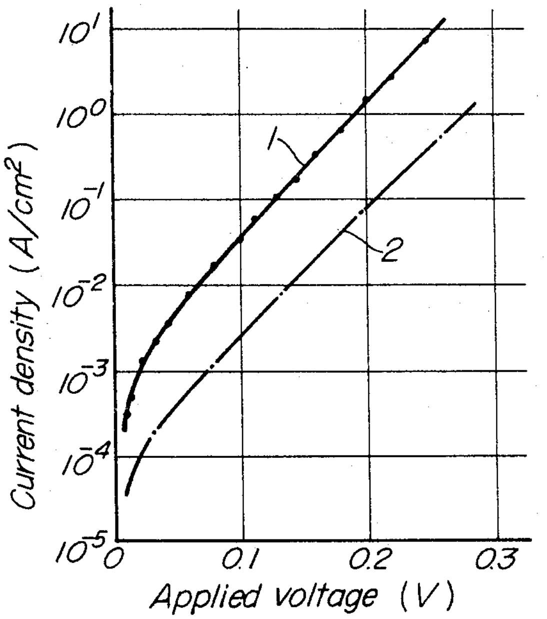
FIG. 5 is a graph indicating the forward voltage-current characteristic of a semiconductor according to FIG. 3, having a molybdenum film.

As seen by the Equation 1 above, the slope of the straight lines 1 and 2, in FIG. 5, gives $q/nkT$. The value of $n$ thus obtained was 1.05 in this embodiment. This compared with $n > 1.2$, usually obtained in the case of a bad Schottky barrier, is closely approximate to $n = 1$ obtainable in the case of a perfect Schottky barrier. Thus, it is obvious that an excellent Schottky barrier is obtainable in this embodiment.

Using a value of $A^*$ of 259 a./cm.$^2$ °K$^2$ which is theoretically calculated for silicon, the barrier height $\phi_B$ can be calculated as 0.57 ev.

The voltage-capacitance characteristic in the Schottky barrier can be given as follows:

(3) $1/C^2 = 2(V_D - V_f)/NqE$ where C is the barrier capacitance per unit area, $V_D$ is the fusion potential as shown in FIG. 7, N is the impurity concentration, E is the dielectric constant of the semiconductor. According to this equation, $V_D$ can be determined from the intercept on the abscissa in FIG. 6.

By obtaining $V_f$, representing the Fermi level of FIG. 7 from donor density N determined from the resistivity measurement or from the slope of the straight line of FIG. 6, $\phi_B$ can be obtained from the sum of $V_D$ and $V_f$. In the case of the example of a diode, it was found to be 0.57 ev.

This value well coincided with the value obtained from the actual measurement of the reverse current density $J_s$ by using the Equation 2. Moreover, it was equal to the value obtained by another method, e.g., the spectral response of the photocurrent.

The above experiment results indicated that an excellent Schottky barrier is formed between the silicon substrate and molybdenum film of this embodiment. Accordingly, the semiconductor device thus obtained, compared with the conventionally known semiconductor devices having a Schottky barrier, e.g., those made from the combinations of germanium-gold, silicon-gold, gallium arsenide-gold, germanium-tungsten, silicon-tungsten or gallium arsenide-tungsten, is provided with such excellent characteristics as described below.

Namely, the primary characteristic of the semi-conductor device of he present invention is that its Schottky barrier is perfect and stable. The reason for this probably is that the temperature of the semiconductor substrate at the time of molybdenum deposition is held at 400° C. to 500° C. Of the conventionally well-known semiconductor devices, the silicon-gold diode is manufactured by vacuum evaporation of gold upon a silicon substrate held at a temperature below 300° C. Because of the low temperature of the substrate, it is difficult to have a high density gold film adhered to the surface of a pure silicon substrate. Thus, their mutual contact becomes imperfect and besides is highly unstable chemically. Accordingly, the surface state greatly affects the characteristics of the diode resulting in such defects as deterioration of the characteristic by gas absorption or by a large distribution of the characteristic in the course of manufacture.

In contrast to this, because the temperature of the semiconductor substrate at the time of metal film deposition is set higher than in the aforementioned prior art devices and because the semiconductor substrate is purified due to the activation of the reduction reaction substance by preheating, a high density, perfect metallic molybdenum film is deposited. Accordingly, the contact between the semiconductor and the metal is perfect and stable with the aforementioned defects being greatly improved.

Again, with the conventional diode using gold, in case it is exposed to a high temperature in the process of manufacture or at the time of operation, the metal will diffuse into the substrate semiconductor leading to a deterioration of its rectifying characteristics, and in extreme cases, the contact between the semiconductor and metal might be made ohmic. In the case of a germanium-gold diode, the contact becomes ohmic at a temperature of 200° C.

In the case of the semiconductor device of this invention, however, because a high density perfect metallic molybdenum film is deposited as mentioned above, it is highly stable, not only in the face of a temperature rise in the process of manufacture, but also to other subsequent temperatures. In the experiments conducted, no change was caused in the characteristic by heating up to 500° C. for five minutes after joint forming. Accordingly, with the conventional diode, it was impossible to raise the temperature for the purpose of installing an ohmic electrode after metal deposition. An ohmic electrode may be mounted, after the molybdenum or tungsten is deposited, by an alloy treatment, say at 400° C., in the case of the present invention. The diffusion coefficient of molybdenum is extremely low as compared with that of gold, and therefore, as compared with a silicon-gold diode, it can remain stable in the face of a longtime temperature rise.

Another characteristic of the semiconductor device of the present invention is that its forward voltage-current density is higher than that of the conventional device. For example, the forward voltage-current density of silicon tungsten, as shown by a straight line 2 in FIG. 5, is considered to be the highest among conventionally known silicon-metal combinations. The forward voltage-current density of the semiconductor device of this invention, shown by straight line 1, is readily seen to be still higher.

Generally, the forward voltage-current density, as is clear from the aforementioned Equation 1, becomes higher as the value of $n$, which shows the perfectness of the Schottky barrier, and the value of the barrier height $\phi_B$ becomes smaller. Of these, $\phi_B$ is determined mainly by the difference between the work function of the metal contacting with the semiconductor and the electron affinity of the semiconductor. In the case of a silicon-gold combination, for example, it is shown to be 0.79 ev., and in the case of a silicon-tungsten combination, it is known to be 0.65 ev.

In contrast to this, in one embodiment of the present invention, molybdenum, having a smaller work function than that of gold or tungsten, is used. $\phi_B$ is made as small as 0.57 ev., as shown in the aforementioned experimental result. Likewise the value of $n$ is as small as 1.05 and thus the forward voltage-current density of the semiconductor of this invention is greater than before, as may be readily proved by Equation 1. The fact the forward voltage-current density of silicon-molybdenum diode is so high has many advantages for mixing, detection, and switching applications.

Generally, the conventional diodes using a Schottky barrier of this sort, as compared with PN junction diodes or point contact diodes, have a smaller injection of holes, that is, minority carriers that have a shorter response for higher frequencies, and consequently, they may be used as microwave diodes, extremely high-speed switching diodes, and varactor diodes. Silicon-gold, arsenide-gold, silicon-tungsten and gallium arsenide-tungsten combinations may be used more frequently.

However, this injection ratio $\gamma$, which shows the rate of injection of holes, is known to have a relation of:

$$(4)\qquad \gamma \propto \exp\ (q\phi_B/kT)$$

against the aforementioned barrier height $\phi_B$, while the semiconductor device of this invention, as mentioned above, has a smaller $\phi_B$ than each of the aforementioned diodes, and accordingly, its hole injection also is smaller and can be provided with a more excellent performance, such as high-speed diodes as mentioned above.

For example, with the conventional silicon-gold diode, the $\phi_B$ of which is 0.79 ev., the injection ratio is about $10^{-7}$ while, with the inventive semiconductor device in case of molybdenum-silicon diode, the $\phi_B$ is 0.57 ev., $\gamma = 0.5 \times 10^{-7}$. Thus, the hole injection is known to be smaller by as much as 50 percent or so. Therefore, in the embodiment shown in FIG. 3, if the resistivity of the silicon substrate 11 is set at 0.001 Ω/cm., its thickness at 0.15 mm., the resistivity of epitaxial layer at 5 Ω/cm., its thickness at 1.5μ, and the diameter of the remaining of a molybdenum layer 13 at 25μ, the response time will become as short as about $10^{-12}$ sec.

Moreover, as is evident from FIG. 6, the inventive semiconductor device has the rare performance, which is seldom seen with the conventional PN-junction diode, that the voltage-capacitance characteristic thereof is in perfect agreement with the change of $V \propto 1/C^2$ in an ideal Schottky barrier. Consequently, it is seen to be excellent also as a varactor diode at high frequency.

Furthermore, the conventional silicon diode had the defect that, in the face of a sudden change of temperature, the silicon would be broken. The semiconductor device of the present invention has greatly eliminated such a defect because the molybdenum used, compared with other metals, has a thermal expansion coefficient nearest to that of silicon and therefore can sufficiently stand its use as a diode for great power. An experiment showed that, when a 50 a. current pulse was charged 20,000 times to molybdenum deposited on a silicon substrate, 3,5 mm. square in size, no damage at all was observed on the silicon substrate.

Figure 9:
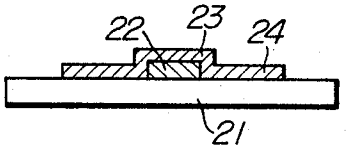
FIG. 9 is a vertical-sectional view showing an example of a thin-film diode according to the present invention.

In the above, describing the characteristics of the invention, a silicon substrate was used as a base for the epitaxial layer. Furthermore, the inventive method may also be applied to the so-called thin-film diode in which such an insulating substrate as sapphire is used, on which the epitaxial layer is formed. In this case the afore-mentioned characteristics are also clearly obtainable. The molybdenum film of this invention is made to adhere very rigidly to such insulating substances as sapphire, quartz, glass, or ceramic. Therefore, for example, as shown in FIG. 9, if a silicon epitaxial layer 22 is provided on the base-insulating substance 21 and a molybdenum film 23 is deposited thereon to make a thin-film diode, another thin-film circuit, for example, may be connected directly to the portion 24 of the molybdenum film 23 located on the insulating substance. With the conventional thin-film diode, however, in case a PN-junction is formed in the epitaxial layer by diffusion, gold or aluminum will have to be vacuum deposited as an ohmic electrode on the diffused layer. However, the contact between the deposited gold or aluminum film and such an insulating substance is always so weak. As a result, it is rather difficult to have another thin-film circuit connected directly to gold or aluminum, in contradistinction to the case with the present invention. Also, with a thin-film diode, having gold or tungsten vacuum deposited on the epitaxial layer, it was extremely difficult to have another thin-film circuit directly connected thereto for the same reasons. Thus, it will be readily understood that, in this respect, likewise, the present invention is provided with an excellent feature.

A specific embodiment for silicon-tungsten diode will be described hereinafter.

First, a 0.2 mm. thick N-type silicon crystal plate with a specific resistance of 0.001 Ω/cm. was formed. On this plate, a 4μ thick N-type silicon epitaxial layer, with a specific resistance of 3Ω/cm., was grown through thermal decomposition of silane ($SiH_4$). This product was put on the heating pedestal 6, as shown in FIG. 2, and was heated and held at between 390° C. and 500° C. by means of the R.F. heater 5. At the same time, while keeping the tungsten hexachloride ($WCl_6$) mounted on the holder 2 at 100° C. by means of the resistance heating unit 4, hydrogen gas was fed in from the conduit 10 at the rate of 2 l. per minute, thereby forming a mixed gas of tungsten hexachloride vapor and hydrogen gas. After passing this gas through the mesh form preheater 8, made of carbon and held between 600° C. and 850° C. by means of the R.F. heater 5, the gas was blown onto the aforementioned substrate 7, whereby a tungsten film was deposited on the substrate. In this instance, with the distance between the silicon substrate 7 and the preheater 8 set at 1.0 cm., the optimum temperature of the silicon substrate was between 420° C. and 480° C., and the optimum temperature of the preheater 8 was 700° C.

Next, the tungsten film of the aforementioned silicon substrate was copper-plated to form a lead-out electrode, after which the area outside the required junction was removed by a photoresist etching method. On the other hand, gold containing 1 percent antimony was put on the back of the silicon substrate at 400° C. to form an ohmic electrode at the alloy junction. Circumferential portions of the tungsten film were removed in order to reduce the leak current that flows through the channel formed toward the surface of the silicon substrate. A diode, as shown in FIG. 3, was thus obtained.

In FIG. 3 reference numeral 11 is silicon substrate, 12 is an epitaxial layer, 13 is a tungsten film, 14 is a gold wire or copper ball electrode, and 15 is an ohmic electrode.

Figure 8:
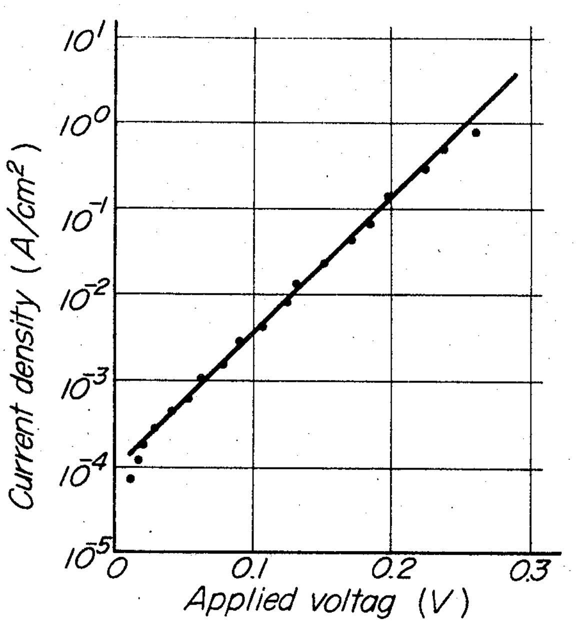
FIG. 8 is a graph showing the forward voltage-current characteristic of a semiconductor according to FIG. 3, having a tungsten film.

The diode manufactured in the manner as described above with a tungsten, possessed the forward voltage-current characteristic shown in FIG. 8. The characteristics is similar to that of the reported silicon-tungsten diode which is shown in the 2 of FIG. 5. The slope of the straight line nearly equaled the theoretical value for an ideal Schottky type barrier, with the theoretical value/measured value=1.02, clearly testifying to the existence of a very good Schottky type barrier. The reverse breakdown voltage of the diode was 20 to 50 v., and the backward saturated current density was $5\times10^{-5}$ a./cm.$^2$. Accordingly, the height of the Schottky type barrier calculated from these values was 0.65 ev.

In the above examples, a silicon crystal plate was employed as the semiconductor substrate. Good diodes may be also obtained using a germanium crystal or a gallium arsenide crystal as the substrate in the same way. That is, the temperature of the semiconductor substrate is maintained within the range of 400° C. to 500° C. in case of molybdenum deposition and within the range of 390° C. to 500° C. in case of tungsten deposition. By using the method of this invention, a molybdenum or a tungsten film may be deposited on such semiconductors as silicon that are grown on such insulating materials as sapphire, quartz, ceramics, or glass, thereby forming the Schottky type barrier at their boundary. It is thus possible to produce thin film diodes.

Figure 10:
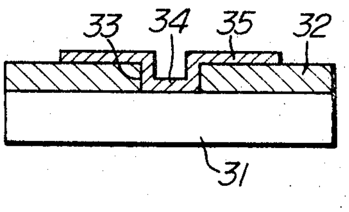
FIG. 10 is a vertical-sectional view of an example of the diode of FIG. 9 used for a solid-state circuit.

Further experiments conducted indicated the deposited molybdenum or tungsten film of this invention may be quite easily deposited on silicon monoxide, silicon dioxide, and other refractory oxides. Thus, with a solid circuit using silicon, as shown in FIG. 10, if a silicon dioxide film 32 is formed on a silicon substrate 31 and a hole of required size is bored therein by, e.g., photoresist etching and upon the silicon dioxide film, including the hole 33, a molybdenum or tungsten film 34 is deposited, the inventive semiconductor device will be formed at the hole 33. Another circuit may be connected directly to the portion 35 of the molybdenum or tungsten film located on the silicon dioxide film 32.

Furthermore, the inventive semiconductor device may also be used for a metal base transistor. Generally, a metal-base transistor is formed by vacuum depositing a semiconductor film, showing N-type conductivity, on the base metal. With the conventional diode, if the temperature of the base is raised at the time of vacuum deposition of the semiconductor film, the Schottky barrier metallic film and the substrate semiconductor will be destroyed as previously mentioned. Accordingly, in the case of the use of gold for the base metal and germanium or silicon for the base semiconductor, the temperature could not be raised above 200° C. for germanium and 300° C. for silicon. In this invention, however, the temperature of the base semiconductor may be raised beyond 500° C. Thus, manufacture of an improved performance metal base transistor is made possible.

As is evident from the explanation described above, by the method of manufacting a diode of this invention, an excellent Schottky type barrier can be formed at the boundary between the semiconductor substrate and a molybdenum or tungsten film deposited thereon. Accordingly, it is possible to manufacture diodes readily which have a Schottky type barrier, the commercial production of which has hitherto been considered very difficult. The diodes obtained in this way may be used for microwave detection and mixing, varactor applications, or high-power applications capable of handling a forward current of over 10 a. Furthermore, their barrier may be used not only as the emitter or collector of a metal base transistor, or as the gate of an electric field effecting type transistor but may also be applied to a photodiode or a radiation detector.

Especially, the silicon molybdenum diodes of the present invention are very advantageous for mixing detecting and switching application owing to its high forward voltage-current density.

The foregoing exemplifications relate to semiconductor devices made by the method of depositing molybdenum and/or tungsten film on semiconductor substrates. The following examples cover the case where molybdenum or tungsten is deposited on various substrates for use in devices other than Schottky devices. The examples given here are the cases where molybdenum is deposited on various substrates other than semiconductors.

The apparatus shown in FIG. 2 was also used. Molybdenum pentachloride 3 was put on the holder 2, and a hard glass substrate 7 was placed on the heating pedestral 6. Both were heated with the former being held at 150° C. and the latter at 450° C. A mesh formed carbon preheater 8 was heated to 700° C. The distance between the preheater 8 and the substrate 7 was 0.7 cm. Hydrogen gas ($H_2$) was let in from the upper part of reaction tube 1 at a rate of 1 l. per min. A dense metallic film of fine-grained molybdenum with a high adhesive strength was deposited on the surface of the hard glass at a growth rate of 100 A./min.

When molybdenum is deposited on copal glass by the usual method, wherein the substrate temperature is higher than 500° C., a brown-colored surface layer is produced, due to the reduction deposition of the ingredient metals of the glass. By the method of the present invention, a metallic film of molybdenum, free from any colored surface layer and having a metallic luster, was obtained by holding the substrate at 400° C. and employing the same conditions as in the aforementioned case.

Besides, an excellent metallic film of molybdenum was likewise deposited on such substrates as a fused quartz glass, ceramic glass, sapphire, ruby, rock crystal, carbon, and rock salts.

The next example concerns an application of the above-described molybdenum film. The glass tube, for use in a gas laser, is a hard glass tube having windows made from optically ground hard glass secured at both ends thereof. Heretofore, a heat treatment at temperatures above 300° C. was impossible because the adhesives used for securing the windows were organic materials.

For this example, a metallic film of molybdenum was deposited, as in the above example, to the thickness of $0.3\mu$ on both ends of the hard glass tube and the peripheral portions of the hard glass windows. Then both parts were soldered together at these metallic films by a soft solder. A glass tube for use in the gas laser capable of withstanding a temperature of 500° C. under $10^{-6}$ mm. Hg vacuum was thus obtained. Consequently, the aforementioned heat treatment to be carried out above 300° C. became practicable.

The following examples give the case where tungsten is deposited on various substrates other than semiconductors:

The apparatus shown in FIG. 2 was also used. Tungsten hexachloride 3 was put on the holder 2 and a hard glass substrate 7 on the heating pedestal 6. Both were heated, and the former was held at 100° C. and the latter at 460° C. A mesh formed carbon preheater 8 was heated to 750° C. and spaced at a distance of 0.8 cm. from the substrate 7. Hydrogen gas ($H_2$) was let in from the upper part of the reaction tube 1 at the rate of 1.5 l. per min. A fine-grained metallic film of tungsten having a high adhesive strength was deposited on the substrate at a rate of growth of 80 A./min.

An excellent metallic film of tungsten was also deposited on such substrates as various ceramics, fused quartz, sapphire, diamond, ruby, rock crystal, carbon, and rock salt.

As is evident from the explanations described above, because the inventive chemical evaporation deposition makes it possible to deposit a metallic film of tungsten on a substrate held at 390° C. to 500° C., and of molybdenum on a substrate held at 400–500° C., the minimum required temperature for the substrate is reduced by a substantial margin. Accordingly, the aforementioned metallic film may be deposited, for example, on a glass having a softening point below 500° C. or on such substances which, at 500° C., are denatured or induce boundary reactions between the substance and the aforementioned metallic film. Therefore, many kinds of materials may be used as the substrate, and this method may be utilized in a wide field of applications. The metallic film obtained by this method possesses perfect and pure metallic nature and is fine grained. This film will follow the fine detail of the substrate surface, without being affected by the irregularity thereof, thus permitting the surface of the substrate to be totally metallized. Furthermore, a mirror-like surface may be obtained by depositing the metallic film on optically ground substrates.

The invention may be embodied in other specific forms without departing from the spirit or essential characteristics thereof. The present embodiment is therefore to be considered in all respects as illustrative and not restrictive, the scope of the invention being indicated by the appended claims, rather than the foregoing description, and all changes which come within the meaning and range of equivalency of the claims are to therefore be embraced therein.

What is claimed is:

1. A method of manufacturing a semiconductor device wherein a metallic film of tungsten is deposited on a semiconductor substrate by hydrogen reduction of tungsten halide, comprising the steps of forming a gaseous mixture of hydrogen and a tungsten halide, heating said substrate to a temperature of from 390° C. to 500° C., passing said gaseous mixture through a preheating zone maintained at a temperature of from 600° C. to 850° C., thereby heating said mixture to a temperature of 600° C.–850° C., and directing the heated gas mixture against said heated substrate whereby said halide is reduced and a tungsten film is deposited on said substrate with formation of a Schottky barrier between said tungsten film and said semiconductor substrate.

2. A method of manufacturing a semiconductor device according to claim 1, wherein said semiconductor substrate is a material selected from the group consisting of germanium, silicon, and gallium arsenide.

3. A method of manufacturing a semiconductor device according to claim 1, wherein said preheating zone is positioned from 0.5 to 1.5 cm. upstream of said semiconductor substrate.

4. A method according to claim 1 wherein the substrate is a silicon epitaxial layer and the tungsten halide is tungsten hexachloride.

5. A method of manufacturing a semiconductor device wherein a metallic film of molybdenum is deposited on a semiconductor substrate by hydrogen reduction of molybdenum halide, comprising the steps of forming a gaseous mixture of hydrogen and molybdenum halide, heating said substrate to a temperature of from 400° C. to 500° C., passing said gaseous mixture through a preheating zone maintained at a temperature of from 600° C. to 900° C., and directing the heated gas mixture against said heated substrate whereby said halide is reduced and a molybdenum film is deposited on said substrate with formation of a Schottky barrier between said molybdenum film and said semiconductor substrate.

6. A method of manufacturing a semiconductor device according to claim 5, wherein said semiconductor substrate is a material selected from the group consisting of germanium, silicon, and gallium arsenide.

7. A method of manufacturing a semiconductor device according to claim 5, wherein said preheating zone is positioned from 0.5 to 1.5 cm. upstream of said semiconductor substrate.

8. A method according to claim 5 wherein the substrate is a silicon epitaxial layer and the molybdenum halide is molybdenum pentachloride.

References Cited

UNITED STATES PATENTS

| | | | |
|---|---|---|---|
| 3,072,983 | 1/1953 | Brenner et al. | 117—107.2 |
| 3,349,297 | 11/1967 | Crowell et al. | 317—235 XR |
| 3,424,627 | 1/1969 | Michel et al. | 317—235 XR |

WILLIAM L. JARVIS, Primary Examiner

U.S. Cl. X.R.

29—198, 571; 117—107.2, 217, 227; 148—174; 317—235